United States Patent
Chi et al.

(10) Patent No.: US 7,920,429 B2
(45) Date of Patent: Apr. 5, 2011

(54) SEMICONDUCTOR MEMORY DEVICE FOR REDUCING POWER CONSUMPTION

(75) Inventors: Sung-Soo Chi, Kyoungki-do (KR); Jae-Jin Lee, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 551 days.

(21) Appl. No.: 12/003,548

(22) Filed: Dec. 28, 2007

(65) Prior Publication Data

US 2008/0239838 A1 Oct. 2, 2008

(30) Foreign Application Priority Data

Mar. 30, 2007 (KR) .................. 10-2007-0031983
Nov. 2, 2007 (KR) .................. 10-2007-0111570

(51) Int. Cl.
*G11C 16/06* (2006.01)
(52) U.S. Cl. .................. 365/185.23; 365/230.6
(58) Field of Classification Search .......... 365/185.23, 365/230.06
See application file for complete search history.

(56) References Cited

U.S. PATENT DOCUMENTS

| | | | | |
|---|---|---|---|---|
| 5,265,052 A * | 11/1993 | D'Arrigo et al. | ........ | 365/185.23 |
| 5,276,652 A * | 1/1994 | Anami | .......... | 365/227 |
| 6,657,915 B2 * | 12/2003 | Seo et al. | ........ | 365/230.06 |

FOREIGN PATENT DOCUMENTS

KR 10-0204792 B1 6/1999

OTHER PUBLICATIONS

Korean Notice of Preliminary Rejection, issued in Korean Patent Application No. KR 10-2007-0111570 dated Dec. 19, 2008.

* cited by examiner

*Primary Examiner* — Hoai V Ho
*Assistant Examiner* — Jason Lappas
(74) *Attorney, Agent, or Firm* — IP & T Group LLP

(57) ABSTRACT

A semiconductor memory device which includes: a voltage supplying unit for outputting a power source voltage as a driving source signal during a predetermined time, and then outputting a high voltage as the driving source signal in response to a driving control signal activated in response to an address signal; and a word line control unit for activating a word line at a voltage level of the driving source signal in response to the driving control signal.

19 Claims, 5 Drawing Sheets

SEMICONDUCTOR MEMORY DEVICE FOR REDUCING POWER CONSUMPTION

CROSS-REFERENCES TO RELATED APPLICATIONS

This application claims priority to Korean patent application numbers 10-2007-0031983 & 10-2007-0111570, filed on Mar. 30, 2007 & Nov. 2, 2007 respectively, which are incorporated by reference in their entirety.

BACKGROUND OF THE INVENTION

The subject matter relates to semiconductor design technology, and more particularly, to a semiconductor memory device including a word line driving device for reduced power consumption.

While a memory capacity of a semiconductor integrated circuit, and more particularly, a semiconductor memory device such as a dynamic random access memory (DRAM) has increased, an external input source voltage has progressively reduced. The semiconductor memory device demands for a high speed operation and for maintaining a time according to a cell data maintenance at least same. In order to correspond to these demands, a boosted voltage generating circuit is included in the semiconductor memory device. The boosted voltage generating circuit boosts an external source voltage to an increased voltage for driving the semiconductor memory device thereby realizing high-speed operation of an internal memory cell.

In case of a general double data rate 2 (DDR2) device, a boosted voltage generating circuit supplies a high voltage of 3.5V by boosting an external source voltage of 1.8V. That is, the boosted voltage generating circuit approximately doubles the external source voltage of 1.8V. In general, the semiconductor memory devices use a Tripler for supplying a boosted voltage. However, this presents challenges for designing a semiconductor memory device fit for low power applications.

Because current consumption increases in accordance with progressively increasing memory capacity, it is necessary to find ways to decrease current consumption. Towards this, multiple boosted voltage generating circuits are included in a semiconductor memory device, with boosted voltage generating circuits respectively designed for particular demanded voltages of the device. Desirable characteristics for a boosted voltage generating circuit design include low current consumption, a small chip area footprint, and the ability to generate a various boosted voltages with only minor design changes.

In a conventional semiconductor memory device, the boosted voltage generating circuit supplies a high voltage VPP to a word line of a memory array and a peripheral circuit. The high voltage VPP generated by the boosted voltage generating circuit is supplied to a substrate voltage generating circuit so that other demanded voltages are derived from the high voltage VPP.

Further, the high voltage VPP is used as a power source of a word line activating circuit. For example, in a DDR2 device where the high voltage VPP is used to activate 4,096 cell transistors, there is large current consumption. In order to design a low power semiconductor memory, it is desirable that minimize use of the high voltage VPP.

FIG. 1 is a block diagram of a conventional word line control unit of a semiconductor memory device.

As shown, the conventional word line control unit includes a first driving signal generating unit 140, a second driving generating signal unit 150, a voltage supplying unit 160 and a word line control unit 170. The first driving signal generating unit 140 generates a first word line driving signal MWLB based on plural address information signals BAX34, BAX56 and BAX78 and a word line activation signal WLOFFB. The second driving signal generating unit 150 generates a second word line driving signal FXB based on the word line activation signal WLOFFB and plural address information signals BAX01 and BAX02. The voltage supplying unit 160 outputs a driving source signal FX at a voltage level of a high voltage VPP (Hereinafter, referring to as "a high voltage level") having a boosted level higher than that of an external voltage VDD based on the second word line driving signal FXB. The word line control unit 170 drives a word line WL with a voltage level of the driving source signal FX in response to the first word line driving signal MWLB and the second word line driving signal FXB.

The semiconductor memory device decodes commands and addresses input from external and internal commands to activate the word line WL during an active operation according to read/write commands and a refresh operation, but deactivate the word line WL during a precharge operation. When the semiconductor memory device requires to deactivate the word line WL, a word line off signal WLOFF (not shown, corresponding to an inverted signal of the word line activation signal WLOFFB) for deactivating the word line WL is activated to a logic high level. Also, the word line activation signal WLOFFB inputted to the first and second driving signal generating units 140 and 150 becomes a logic low level. When the semiconductor memory device performs an active operation, the word line off signal WLOFF becomes a logic low level and the word line activation signal WLOFFB is activated to a logic high level. Generally, the word line off signal WLOFF or the word line activation signal WLOFFB is generated in response to a precharge command PCG for indicating the precharge operation.

To activate the word line WL at the high voltage level, the first and second driving signal generating units 140 and 150 outputs the first and second word line driving signals MWLB and FXB with a logic low level. The voltage supplying unit 160 supplies the driving source signal FX of the high voltage level to the word line control unit 170 in response to the second word line driving signal FXB. Thereafter, to deactivate the word line WL, the first and second driving signal generating units 140 and 150 outputs the first and second word line driving signals MWLB and FXB with a logic high level. Thus, the word line control unit 170 discharges the high voltage level supplied to the word line WL to thereby deactivating the word line WL.

FIG. 2 is a circuit diagram of the voltage supplying unit 160 shown in FIG. 1.

As shown, the voltage supplying unit 160 outputs the driving source signal FX with the high voltage level or a voltage level of a ground voltage VSS (Hereinafter, referring to as "a ground voltage level") in response to the second word line driving signal FXB.

In detail, the voltage supplying unit 160 includes a PMOS transistor for outputting the driving source signal FX with the high voltage level when the second word line driving signal FXB has a logic low level, and an NMOS transistor for outputting the driving source signal FX with the ground voltage level when the second word line driving signal FXB has a logic high level.

FIG. 3 is a circuit diagram of the word line control unit 170 shown in FIG. 1.

As shown, the word line control unit 170 includes a PMOS transistor PM1, a first NMOS transistor NM1, and a second NMOS transistor NM2. The PMOS transistor PM1 drives the word line WL to the voltage level of the driving source signal FX in response to an activation of the first word line driving signal MWLB. The first NMOS transistor NM1 makes the word line WL to the ground voltage level in response to an inactivation of the first word line driving control signal MWLB. The second NMOS transistor NM2 makes the word line WL to the ground voltage level in response to an activation of the second word line driving signal FXB.

Upon operation, if the first word line driving signal MWLB is activated to a logic low level, the PMOS transistor PM1 becomes active and drives the word line WL to the voltage level of the driving source signal FX. If both of the first word line driving signal MWLB and the second word line driving signal FXB are inactivated at a logic high level, the first and second NMOS transistors NM1 and NM2 having a gate receiving the first word line driving signal MWLB and the second word line driving signal FXB become active and drive the word line WL to the ground voltage level.

The aforesaid word line control unit 170 may supply the high voltage level to the word line WL in response to the address information signals BAX01, BAX02, BAX34, BAX56 and BAX78. Herein, the address information signals are generated by decoding addresses (BA0 to BA8) inputted through address pins, and the semiconductor memory device includes the word line control unit according to predetermined groups of the addresses for designating unit cells.

Hereinafter, an operation of the word line control unit 170 shown in FIG. 1 will be described briefly.

First of all, after finishing the precharge operation, an address, along with an active command ACT for access of a memory, is supplied. The plurality of address information signals BAX01, BAX02, BAX34, BAX56 and BAX78 are activated to a logic high level by decoding the address. At this time, the word line activation signal WLOFFB is activated to a logic high level.

At the same time, first driving signal generating unit 140 activates the first word line driving signal MWLB at a logic low level according as the plural address information signals BAX34, BAX56 and BAX78 are activated to a logic high level. The second driving signal generating unit 150 activates the second word line driving signal FXB to a logic low level according as the address information signals BAX01 and BAX02 are activated to a logic high level. The voltage supplying unit 160 outputs the driving source signal FX to the high voltage level in response to an activation of the second word line driving signal FXB. Accordingly, the word line control unit 170 drives the word line WL to the voltage level of the driving source signal FX of the high voltage level in response to an activation of the first word line driving signal MWLB.

If a precharge command PCG is applied, the word line activation signal WLOFFB is inactivated to a logic low level.

The first driving signal generating unit 140 deactivates the first word line driving signal MWLB to a logic high level in response to a deactivation of the word line activation signal WLOFFB. The second driving signal generating unit 150 deactivates the second word line driving signal FXB to a logic high level in response to the activation of the word line activation signal WLOFFB. The voltage supplying unit 160 outputs the driving source signal FX of the ground voltage level in response to the second word line driving signal FXB of a logic high level. The word line control unit 170 drives the word line WL to the ground voltage level in response to the first word line driving signal MWLB of a logic high level.

As described above, when the address is input with the active command ACT, the semiconductor memory device including a conventional word line control unit drives the corresponding word line WL to the high voltage level. Further, if the precharge command PCG is input, the semiconductor memory device deactivates the corresponding activated word line WL.

However, when the word line WL is activated from the ground voltage level to the high voltage level, causing a voltage level of the word line WL to raise suddenly, large current consumption occurs. In particular, the number of unit cells coupled to the word line WL increases according as the memory capacity increases, and thus large current consumption can occur. It makes difficult to design the semiconductor memory device fit for low power circumstance.

SUMMARY OF THE INVENTION

Embodiments of the present invention directed to providing a semiconductor memory device including a word line driving device for low power consumption.

In accordance with a first of the present invention, there is provided a semiconductor memory device, including: a voltage supplying unit for outputting a power source voltage as a driving source signal during a predetermined time, and then outputting a high voltage as the driving source signal in response to a driving control signal activated in response to an address signal; and a word line control unit for activating a word line at a voltage level of the driving source signal in response to the driving control signal.

In accordance with a second aspect of the present invention, there is provided a semiconductor memory device, including: a first driving signal generating unit for generating a first word line driving signal based on a word line activation signal and a first address information signal; a second driving signal generating unit for generating a second word line driving signal based on the word line activation signal and a second address information signal; an access control unit for outputting a control signal for determining a predetermined time in response to an active signal; a voltage supplying unit for outputting a power source voltage as a driving source signal during the predetermined time, and then outputting a high voltage as the driving source signal in response to the second word line driving signal and the control signal; and a word line control unit for activating a word line at a voltage level of the driving source signal in response to the first and second word line driving signals.

In accordance with a third aspect of the present invention, there is provided a method for driving a semiconductor memory device, including: activating a word line activation signal corresponding to a precharge command; outputting first and second word line driving signals based on the word line activation signal and first and second address information signals; outputting a power source voltage as a driving source signal during a predetermined time, and then outputting a high voltage as the driving source signal in response to the second word line driving signal and a control signal for determining the predetermined time in response to an active signal; and activating a word line at a voltage level of the driving source signal in response to the first and second word line driving signals.

DETAILED DESCRIPTION

Hereinafter, a word line control unit of a semiconductor memory device in accordance with exemplary embodiments of the present invention will be described in detail with reference to the accompanying drawings.

Figure 4:
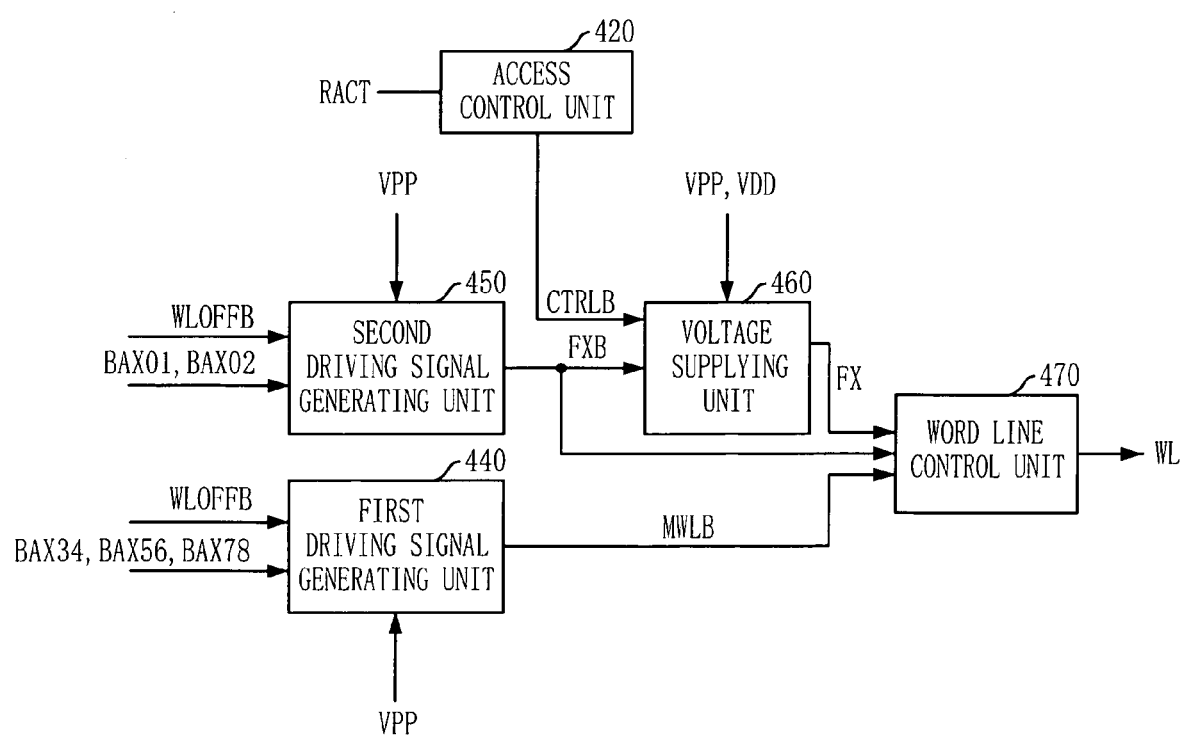
FIG. 4 is a block diagram of a word line control unit of a semiconductor memory device in accordance with an embodiment of the present invention.

FIG. 4 is a block diagram of a word line control unit of a semiconductor memory device in accordance with an embodiment of the present invention.

As shown, the illustrated word line control unit includes an access control unit 420, a first driving signal generating unit 440, a second driving signal generating unit 450, a voltage supplying unit 460 and a word line control unit 470. The access control unit 420 activates a control signal CTRLB in response to an active signal RACT. The first driving signal generating unit 440 generates a first word line driving signal MWLB based on a word line activation signal WLOFFB and a plurality of first address information signals BAX34, BAX56 and BAX78. The second driving signal generating unit 450 generates a second word line driving signal FXB based on the word line activation signal WLOFFB and a plurality of second address information signals BAX01 and BAX02. The voltage supplying unit 460 drives a driving source signal FX to a voltage level of an external voltage VDD (Hereinafter, referring to as "an external voltage level") or a high voltage level in response to the control signal CTRLB and the second word line driving signal FXB. The word line control unit 470 drives a word line WL to a voltage level of the driving source signal FX in response to the first word line driving signal MWLB and the second word line driving signal FXB.

As a semiconductor memory device becomes more highly integrated and a memory capacity increases under low power conditions, a size of a unit cell for storing data decreases and a size of a capacitor included in the unit cell also decreases. For transferring data between the unit cell and a bit line at high speed and reducing charge stored in the capacitor corresponding to a logic high level of the data, the semiconductor memory device drives the word line WL to the high voltage level having a voltage level higher than that of the external voltage level. That is, when the word line WL is deactivated with a ground voltage level and activated with the high voltage level.

In accordance with the disclosed embodiment, the voltage supplying unit 460, for determining a voltage level supplied to the word line WL, outputs the driving source signal FX of the high voltage level after outputting the driving source signal FX of the external voltage level for a predetermined time. In detail, the voltage supplying unit 460 outputs the driving source signal FX at the external voltage level when the control signal CTRLB is activated to a logic low level, and outputs the driving source signal FX at the high voltage level when the control signal CTRLB is deactivated and the second word line driving signal FXB is activated. The control signal CTRLB is a control signal for supplying an external voltage VDD during a predetermined time corresponding to an activation period of the word line WL in response to the active signal RACT.

Furthermore, when outputting the driving source signal FX at the ground voltage level rather than the high voltage level in order to deactivate the word line WL, the voltage supplying unit 460 outputs the driving source signal FX at the ground voltage level after outputting the driving source signal FX of the external voltage level for a predetermined time.

The conventional semiconductor memory device supplies a high voltage VPP to activate the word line WL at the ground voltage level, thereby reducing a time required to activate the word line WL. However, large current consumption occurs because a difference between a ground voltage VSS and the high voltage VPP is greater than the difference with the external voltage VDD. Further, the high voltage VPP is suddenly supplied to activate the word line WL, and thus, the high voltage level generated by a boosted voltage generating circuit with in the semiconductor memory device can become unstable.

In the disclosed embodiment, to activate the word line WL of the ground voltage VSS, the semiconductor memory device supplies the driving source signal FX at the external voltage level for a predetermined time at the beginning. Then, the semiconductor memory device supplies the driving source signal FX at the high voltage level after the voltage level of the word line WL reaches the external voltage level. Accordingly, the semiconductor memory device activates the word line WL with a stable voltage level by supplying the external voltage VDD and the high voltage VPP in consecutive order. As a result, it is possible to solve an instability in the voltage level due to a sudden current consumption occurring when only the high voltage VPP is used.

The disclosed embodiment raises the voltage level of the word line WL by supplying the external voltage VDD and the high voltage VPP in consecutive order while conventional devices raise the voltage level of the word line WL by using only the high voltage VPP. Accordingly, although the present invention may operate more slowly than a conventional device, the present invention can perform normal active operations and a precharge operations by controlling an activation timing of the control signal CTRLB based on a period of an external clock which determines an operating speed of the semiconductor memory device, and an operating margin for the active operation and the precharge operation. Further, when deactivating the word line WL, the control signal CTRLB is activated so as to supply the external voltage VDD and reduce a time for supplying the high voltage VPP. As a result, it is possible to reduce power consumption.

As described above, the disclosed embodiment supplies the external voltage VDD as well as the high voltage VPP to the word line WL within the range of tolerances for guaranteeing the operating margin for the active operation. Accordingly, it is possible to reduce power consumption due to the high voltage VPP and stabilize the high voltage level.

Referring to FIG. 4, the first driving signal generating unit 440 receives the first address information signals BAX34, BAX56 and BAX78, and the second driving signal generating unit 450 receives the second address information signals BAX01 and BAX02. The first address information signals BAX34, BAX56 and BAX78 are generated by decoding an address A<3:8>, and the second address information signals BAX01 and BAX02 is generated by decoding an address A<0:2>. In this embodiment, the first and second address information signals are divided according to a compression decoding rate of an address decoder provided within the semiconductor memory device for reducing the number of signal lines. In accordance with the embodiment of the present invention, for example, a 512M semiconductor memory device includes an address decoder having a compression decoding rate of 8:1. There is a total of 72 signal lines, including 8 lines of 3-bits and 64 lines of 6-bits.

Figure 5A:
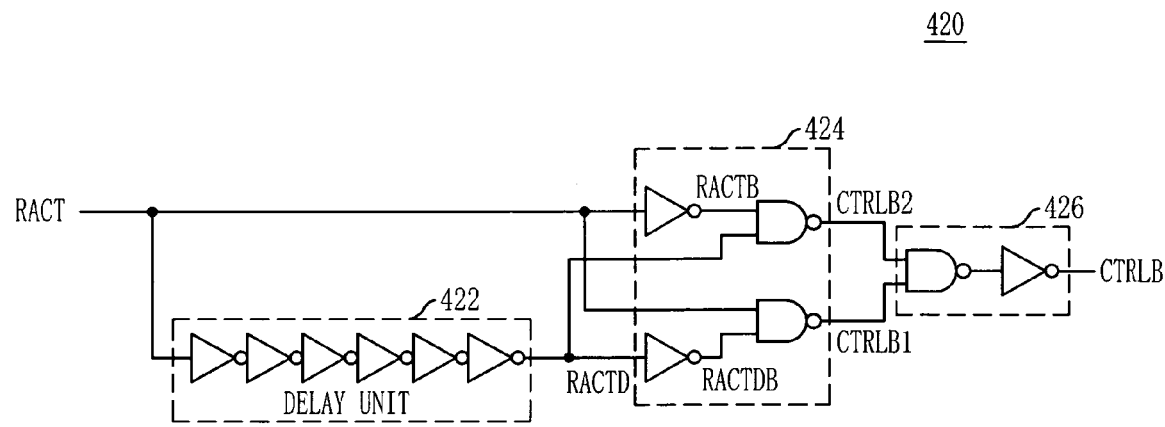
FIG. 5A is a circuit diagram of an access control unit illustrated in FIG. 4.

FIG. 5A is a circuit diagram of the access control unit 420 illustrated in FIG. 4.

Referring to FIG. 5A, the access control unit 420 includes a delay unit 422, a timing detection unit 424, and a logic combination unit 426. When the active signal RACT corresponding to an external command is activated, the corresponding word line WL is activated to access the unit cell. The access control unit 420 outputs the control signal CTRLB for supplying not the high voltage VPP but the external voltage VDD to the word line WL by detecting a beginning and an end of an activation period for the word line WL.

The delay unit 422 includes a plurality of inverters coupled in series, for receiving the active signal RACT and outputting a delayed active signal RACTD. A delay amount of the delay unit 422 becomes an activation period for the control signal CTRLB.

The timing detection unit 424 logically combines the active signal RACT and the delayed active signal RACTD to output a beginning control signal CTRLB1 and an end control signal CTRLB2, each activated during a beginning and end of the activation period of the word line WL corresponding to the delay amount of the delay unit 422.

In detail, the timing detection unit 424 includes inverters and NAND gates. The timing detection unit 424 inverts the active signal RACT and the delayed active signal RACTD to output an inverted active signal RACTB and an inverted delayed active signal RACTDB, respectively. Then, the timing detection unit 424 performs a NAND operation on the inverted active signal RACTB and the delayed active signal RACTD to output the end control signal CTRLB2, which is activated during the end of the activation period of the word line WL, and performs a NAND operation on the active signal RACT and the inverted delayed active signal RACTDB to output the beginning control signal CTRLB1, which is activated during a beginning of the activation period of the word line WL.

The logic combination unit 426 performs an AND operation on the beginning control signal CTRLB1 and the end control signal CTRLB2 to output the control signal CTRLB.

Figure 5B:
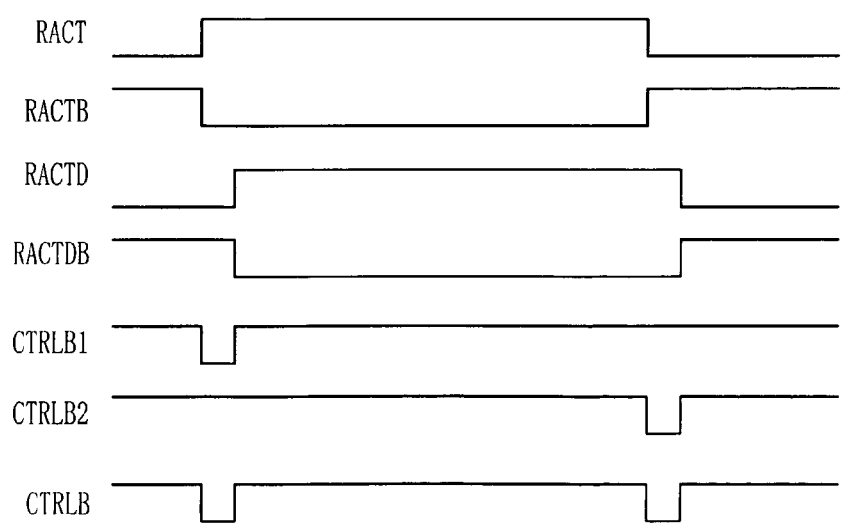
FIG. 5B is a waveform diagram illustrating an operation of the access control unit illustrated in FIG. 5A.

FIG. 5B is a waveform diagram illustrating an operation of the access control unit 420 illustrated in FIG. 5A.

Referring to FIG. 5B, the access control unit 420 generates the control signal CTRLB activated during a predetermined time corresponding to a beginning and an end of the activation period of the word line WL in response to the active signal RACT.

Figure 6:
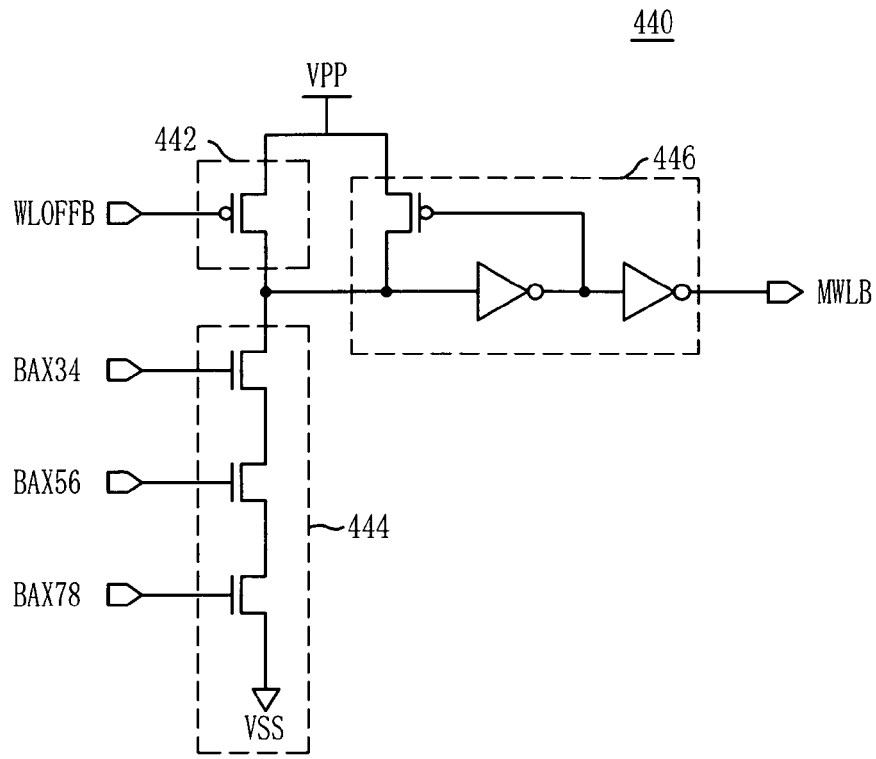
FIG. 6 is a circuit diagram of a first word line driving signal generating unit illustrated in FIG. 4.

FIG. 6 is a circuit diagram of the first driving signal generating unit 440 illustrated in FIG. 4.

Referring to FIG. 6, the first driving signal generating unit 440 includes a driving unit 442, an activation unit 444 and a latch unit 446. The driving unit 442 drives the first word line driving signal MWLB to the high voltage level in response to the word line activation signal WLOFFB. The activation unit 444 activates the first word line driving signal MWLB to a logic low level in response to the first address information signals BAX34, BAX56 and BAX78. The latch unit 446 latches outputs of the driving unit 442 and the activation unit 444 to output the first word line driving signal MWLB.

Herein, if the word line activation signal WLOFFB is inactivated to a logic low level in response to the precharge command PCG, the driving unit 442 drives the first word line driving signal MWLB to the high voltage level. If the precharge operation is finished or the active command ACT is applied, the word line activation signal WLOFFB is activated to a logic high level to thereby stop supplying the first word line driving signal MWLB with the high voltage level.

Upon operation, if an address is applied in conjunction with the active command ACT, corresponding first address information signals BAX34, BAX56 and BAX78 are activated to a logic high level.

Subsequently, the activation unit 444 activates the first word line driving signal MWLB to a logic low level in response to the first address information signals BAX34, BAX56 and BAX78 and the latch unit 446 maintains the first word line driving signal MWLB at a logic low level until the word line activation signal WLOFFB become a logic low level.

If the word line activation signal WLOFFB is deactivated to a logic low level after the precharge command PCG is inputted, the driving unit 442 drives the first word line driving signal MWLB to the high voltage level in response to the word line activation signal WLOFFB. Subsequently, the latch unit 446 maintains the first word line driving signal MWLB at the high voltage level. Herein, two inverters included in the latch unit 446 receive the high voltage VPP as an operating voltage.

Figure 7:
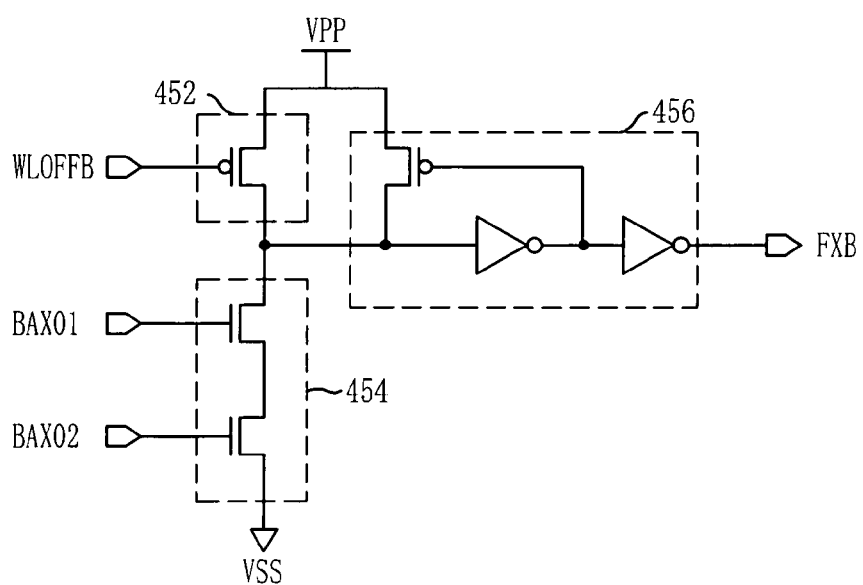
FIG. 7 is a circuit diagram of a second word line driving signal generating unit illustrated in FIG. 4.

FIG. 7 is a circuit diagram of the second driving signal generating unit 450 illustrated in FIG. 4.

Referring to FIG. 7, the second driving signal generating unit 450 includes a driving unit 452, an activation unit 454 and a latch unit 456. The driving unit 452 drives the second word line driving signal FXB to the high voltage level in response to the word line activation signal WLOFFB. The activation unit 454 activates the second word line driving signal FXB to a logic low level in response to the second address information signals BAX34, BAX56 and BAX78. The latch unit 456 latches outputs of the driving unit 452 and the activation unit 454 to output the second word line driving signal FXB.

The second driving signal generating unit 450 has a similar structure to that of the first driving signal generating unit 440 shown in FIG. 6, except for there are only two address information signals BAX01 and BAX02 with a corresponding number of transistors. Therefore, a description of a detailed circuit structure is omitted.

Upon operation, the corresponding second address information signals BAX01 and BAX02 are activated to a logic high level after the address in conjunction with the active command ACT are input. The second driving signal generating unit 450 drives the second word line driving signal FXB to a logic low level in response to the second address information signals BAX01 and BAX02.

If the word line activation signal WLOFFB is deactivated to a logic low level after the precharge command PCG is input, the second driving signal generating unit 450 deactivates the second word line driving signal FXB to the high voltage level.

Figure 1:
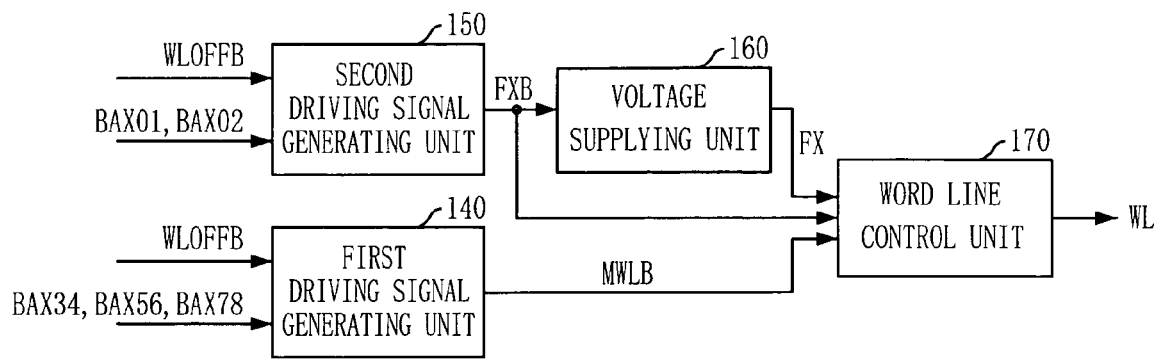
FIG. 1 is a block diagram of a conventional word line control unit of a semiconductor memory device.
Figure 2:
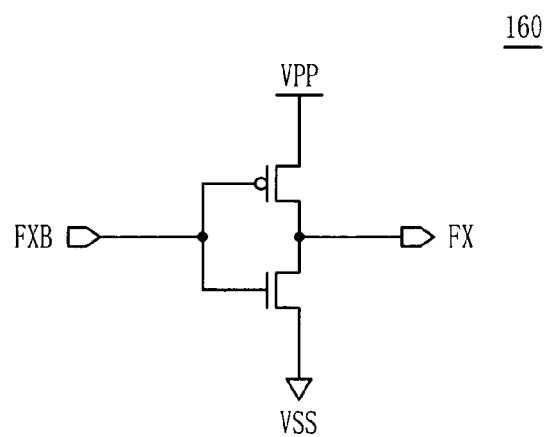
FIG. 2 is a circuit diagram of a voltage supplying unit illustrated in FIG. 1.
Figure 3:
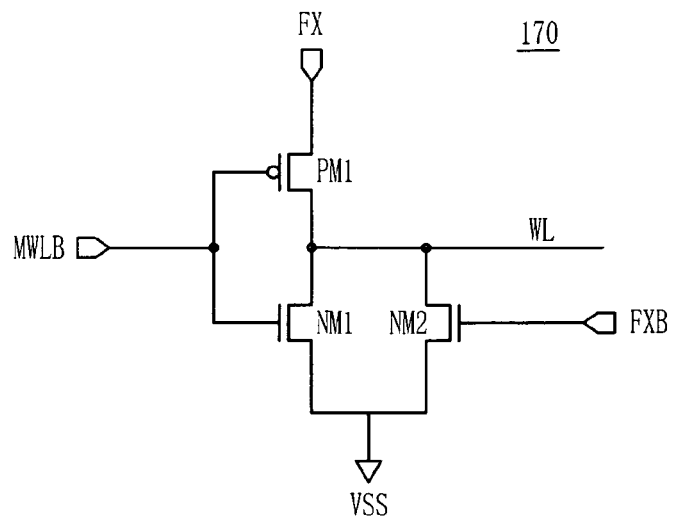
FIG. 3 is a circuit diagram of a word line control unit illustrated in FIG. 1.

Meanwhile, the word line control unit 470 has substantially the same structure as that of the word line control unit 170 illustrated in FIG. 3. After finishing the active operation and a refresh operation, the word line control unit 470 supplies the driving source signal FX of the external voltage level to the word line WL for a predetermined time, and then discharges the word line WL to the ground voltage level in response to the first word line driving signal MWLB and the second word line driving signal FXB at the high voltage level. The first word line driving signal MWLB and the second word line driving signal FXB of the high voltage level are used to discharge the word line WL quickly and completely.

Figure 8:
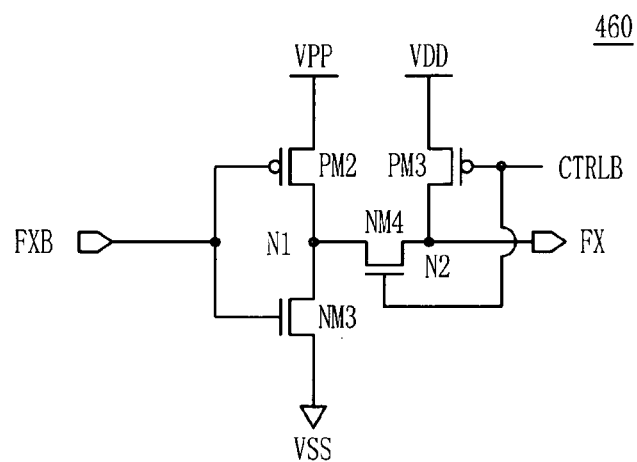
FIG. 8 is a circuit diagram of a voltage supplying unit illustrated in FIG. 4.

FIG. 8 is a circuit diagram of the voltage supplying unit 460 illustrated in FIG. 4.

Referring to FIG. 8, the voltage supplying unit 460 includes a first full-up driving unit PM2, a second full-up driving unit PM3, a full-down driving unit NM3, and a switch NM4. The first full-up driving unit PM2 drives the driving source signal FX to the high voltage level in response to the second word line driving signal FXB. The second full-up driving unit PM3 drives the driving source signal FX to the external voltage level in response to the control signal CTRLB. The full-down driving unit NM3 drives the driving source signal FX to the ground voltage level in response to the second word line driving signal FXB. The switch NM4 switches between supplying the outputs of the first full-up driving unit PM2 and the full-down driving unit NM3 as the driving source signal FX, in response to the control signal CTRLB.

The first full-up driving unit PM2 includes a PMOS transistor with a gate receiving the second word line driving signal FXB and a source-drain path between the high voltage VPP and a node N1. The second full-up driving unit PM3 includes a PMOS transistor with a gate receiving the control signal CTRLB and a source-drain path between the external voltage VDD and the node N1. The full-down driving unit NM3 includes an NMOS transistor with a gate receiving the second word line driving signal FXB and a source-drain path between the ground voltage VSS and the node N1. The switch NM4 includes an NMOS transistor with a gate receiving control signal CTRLB and a source-drain path between the node N1 and an output node N2.

For reference, the control signal CTRLB maintains a deactivation state at a logic high level and is activated at a logic low level during a predetermined time corresponding to a beginning and an end of the activation period of the word line WL in response to the active signal RACT.

Hereinafter, an operation of the voltage supplying unit 460 will be described briefly.

First, if the control signal CTRLB is activated at a logic low level, the second full-up driving unit PM3 becomes active and drives the driving source signal FX to the external voltage level. At this time, the switch NM4 is turned off so as not to supply the outputs of the first full-up driving unit PM2 and the full-down driving unit NM3 as the driving source signal FX.

When the control signal CTRLB is deactivated at a logic high level and the second word line driving signal FXB is activated to a logic low level, the first full-up driving unit PM2 becomes active and drives the driving source signal FX at the high voltage level.

Therefore, to activate the word line WL, the driving source signal FX changes from the ground voltage level to the external voltage level when the level control signal CTRLB is activated. Then, the driving source signal FX changes from the external voltage level to the high voltage level when the second word line driving signal FXB is activated.

Meanwhile, the second full-up driving unit PM3 drives the driving source signal FX to the external voltage level when the control signal CTRLB is activated. At this time, the switch NM4 is turned off so as not to supply the outputs of the first full-up driving unit PM2 and the full-down driving unit NM3 as the driving source signal FX.

Subsequently, if the control signal CTRLB is deactivated and the second word line driving signal FXB is deactivated at a logic high level, the full-down driving unit NM3 becomes active and drives the driving source signal FX at the ground voltage level.

Therefore, to deactivate the word line WL, the driving source signal FX changes from the high voltage level to the external voltage level in response to an activation of the control signal CTRLB, and changes from the external voltage level to the ground voltage level in response to deactivation of the second word line driving signal FXB.

In accordance with the disclosed embodiment, the voltage level of the word line WL does not change directly, but step-by-step from the ground voltage level to the high voltage level or from the high voltage level to the ground voltage level. Therefore, current consumption according to use of the high voltage VPP can be reduced as compared with a conventional design. Furthermore, there is no need for a separate process to generate the external voltage VDD, because the external voltage VDD is supplied externally. Accordingly, an additional boosted voltage generating circuit is not required within the semiconductor memory device, and it is possible to more stably maintain the voltage levels of other internal voltages.

Figure 9:
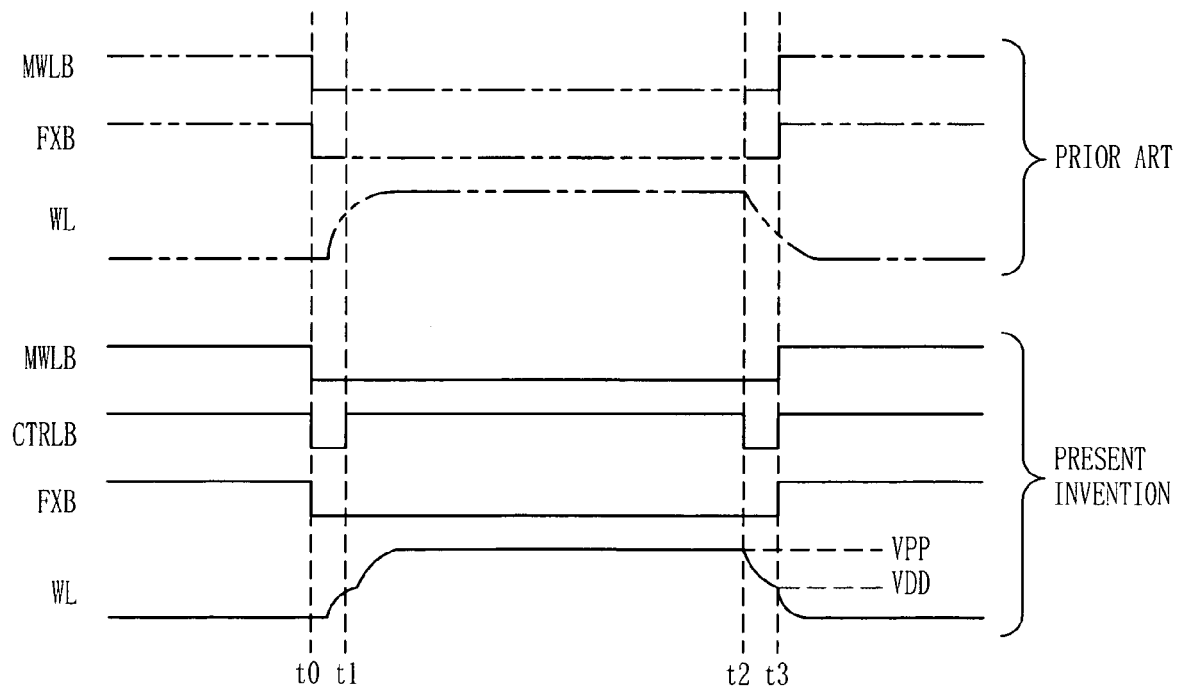
FIG. 9 is a waveform diagram illustrating an operation of the word line control unit illustrated in FIG. 4.

FIG. 9 is a waveform diagram illustrating an operation of the word line control unit illustrated in FIG. 4.

Especially, the waveform diagram illustrates a waveform of a prior art device and a waveform of the disclosed embodiment. As discussed above, the disclosed embodiment activates the word line WL by using the external voltage VDD as well as the high voltage VPP, while the prior art activates the word line WL by using only the high voltage VPP.

First of all, the waveform diagram in accordance with the disclosed embodiment will be described.

An address is input with the active command ACT for accessing the memory. By decoding the address, a plurality of address information signals BAX01, BAX02, BAX34, BAX56 and BAX78 are activated at a logic high level. At this time, the word line activation signal WLOFFB is activated to a logic high level.

Subsequently, the first driving signal generating unit 440 activates the first word line driving signal MWLB at a logic low level in response to activations of the first address information signals BAX34, BAX56 and BAX78, and the second driving signal generating unit 450 activates the second word line driving signal FXB at a logic low level in response to an activation of the second address information signals BAX01 and BAX02. At this time, time t0, the control signal CTRLB is activated at a logic low level during the predetermined time corresponding to a beginning of the activation period of the word line WL in response to the active signal RACT, that is, until time t1.

The voltage supplying unit 460 boosts the driving source signal FX from the ground voltage level to the external voltage level in response to the control signal CTRLB during the predetermined time, i.e., from t0 to t1. Then, the voltage supplying unit 460 boosts the driving source signal FX from external voltage level to the high voltage level in response to second word line driving signal FXB after the predetermined time, i.e., after t1. Accordingly, the word line control unit 470 can drive the word line WL in consecutive order from the ground voltage level to the high voltage level after driving word line WL at the intermediate external voltage level.

Next, if the precharge command PCG is applied, the word line activation signal WLOFFB is deactivated at a logic low level.

Subsequently, the first driving signal generating unit 440 deactivates the first word line driving signal MWLB at a logic high level in response to the word line activation signal WLOFFB, and the second driving signal generating unit 450 deactivates the second word line driving signal FXB at a logic high level in response to the word line activation signal WLOFFB. At this time, the control signal CTRLB is activated at a logic low level during the predetermined time corresponding to the end of the activation period of the word line WL in response to the active signal RACT, that is, from t2 to t3.

The voltage supplying unit 460 changes the driving source signal FX from the high voltage level to the external voltage level in response to the control signal CTRLB during the predetermined time, i.e., from t2 to t3. Then, the voltage supplying unit 460 outputs the driving source signal FX from external voltage level to the ground voltage level in response to second word line driving signal FXB after the predetermined time, i.e., after t3. Accordingly, the word line control unit 470 can drive the word line WL in consecutive order from the high voltage level to the ground voltage level after driving word line WL at the intermediate external voltage level.

As described above, the disclosed embodiment can reduce power consumption by decreasing use of the high voltage VPP by activating the word line WL to the high voltage level through several steps.

In accordance with the disclosed embodiment, a semiconductor memory device activates a word line WL with a stable voltage level by supplying an external voltage VDD and a high voltage VPP in consecutive order. As a result, it is possible to address instability of the voltage level due to sudden current consumption occurring in the case where only the high voltage VPP is used. At the same time, it is possible to guarantee a high-speed semiconductor memory device while maintaining an operating margin for performing an active operation and a refresh operation with reduced power consumption by adjusting a time when a power source voltage is used.

While the disclosed embodiment illustrates a case in which the word line WL is activated and inactivated through the external voltage level, it is only an example. It can be applied to other cases of activating and deactivating the word line WL through a intermediate level voltage between the ground voltage level and the high voltage level. The control signal can be also activated during a predetermined time corresponding to a beginning and end of an activation period of the word line WL.

While the present invention has been described with respect to the specific embodiments, it will be apparent to those skilled in the art that various transpositions, changes, and modifications may be made without departing from the spirit and scope of the invention as defined in the following claims.

What is claimed is:

1. A semiconductor memory device, comprising:
   an access control unit for outputting a control signal for a predetermined time period in response to an active signal:
   a voltage supplying unit for outputting a power source voltage as a driving source signal during a predetermined time period of a transition period between a deactivation of a word line and an activation of the word line, and then outputting a high voltage greater than the power source voltage as the driving source signal in response to a driving signal activated in response to an address signal during the succeeding time period of the transition period; and
   a word line control unit for activating the word line at a voltage level of the driving source signal in response to the driving signal,
   wherein the voltage supplying unit outputs the power source voltage as a driving source signal when the control signal is activated, and outputs the high voltage as the driving source signal when the driving signal is activated and the control signal is deactivated,
   wherein the access control unit includes:
   a delay unit for delaying the active signal for a predetermined time to output a delayed active signal:
   a timing detection unit for outputting a beginning control signal and an end control signal, each control signal respectively activated during a beginning and an end of an activation period of the word line based on the active signal and the delayed active signal; and
   a logic combination unit for outputting the control signal by combining the beginning control signal and the end control signal,
   wherein the timing detection unit includes:
   a first inverter for inverting the active signal to output an inverted active signal;
   a first logic gate for performing a NAND operation on the inverted active signal and the delayed active signal to output the end control signal;
   a second inverter for inverting the delayed active signal to output an inverted delayed active signal; and
   a second logic gate for performing a NAND operation on the active signal and the inverted delayed active signal to output the beginning control signal.

2. The semiconductor memory device as recited in claim 1, wherein the predetermined time period is determined based on a period of an external clock which determines an operating speed of the semiconductor memory device, and an operating margin for an active operation.

3. The semiconductor memory device as recited in claim 1, further comprising:
   a first driving signal generating unit for generating a first word line driving signal based on a word line activation signal corresponding to a precharge command and a first address information signal to output it to the word line control unit; and
   a second driving signal generating unit for generating a second word line driving signal based on the word line activation signal and a second address information signal to output it to the voltage supplying unit and the word line control unit,
   wherein the driving signal includes the first and second word line driving signals.

4. The semiconductor memory device as recited in claim 3, wherein the voltage supplying unit includes:
   a first pull-up driving unit for driving the driving source signal to the high voltage in response to the second word line driving signal;
   a pull-down driving unit for driving the driving source signal to a ground voltage in response to the second word line driving signal;
   a switch for determining which one of the first pull-up driving unit and the pull-down driving unit is output as the driving source signal in response to the control signal; and
   a second pull-up driving unit for driving the driving source signal to the power source voltage in response to the control signal.

5. The semiconductor memory device as recited in claim 4, wherein the second pull-up driving unit includes a PMOS transistor driving the driving source signal to the power source voltage when the control signal is activated at a logic low level.

6. The semiconductor memory device as recited in claim 4, wherein the switch includes an NMOS transistor supplying the outputs of the first pull-up driving unit and the pull-down driving unit as the driving source signal when the control signal is deactivated at a logic high level.

7. The semiconductor memory device as recited in claim 4, wherein the first pull-up driving unit includes a PMOS transistor driving the driving source signal to the high voltage when the second word line driving signal is activated at a logic low level, and the pull-down driving unit includes an NMOS transistor driving the driving source signal to the ground voltage when the second word line driving signal is deactivated at a logic high level.

8. The semiconductor memory device as recited in claim 3, wherein the first driving signal generating unit includes:
  a first driving unit for driving the first word line driving signal to the high voltage in response to the word line activation signal;
  a first activation unit for activating the first word line driving signal at a logic low level in response to the first address information signal; and
  a first latch unit for latching outputs of the first driving unit and the first activation unit to output the first word line driving signal.

9. The semiconductor memory device as recited in claim 8, wherein the second driving signal generating unit includes:
  a second driving unit for driving the second word line driving signal at the high voltage in response to the word line activation signal;
  a second activation unit for activating the second word line driving signal at a logic low level in response to the second address information signal; and
  a second latch unit for latching outputs of the second driving unit and the second activation unit to output the second word line driving signal.

10. The semiconductor memory device as recited in claim 9, wherein, after finishing an active operation and a refresh operation, the word line control unit supplies the power source voltage as the driving source signal for the predetermined time period, and then discharges the word line to a ground voltage in response to the first and second word line driving signals of the high voltage level.

11. A semiconductor memory device, comprising:
  a first driving signal generating unit for generating a first word line driving signal based on a word line activation signal and a first address information signal;
  a second driving signal generating unit for generating a second word line driving signal based on the word line activation signal and a second address information signal;
  an access control unit for outputting a control signal for determining a predetermined time period of a transition period between a deactivation of a word line and an activation of the word line in response to an active signal;
  a voltage supplying unit for outputting a power source voltage as a driving source signal during the predetermined time period, and then outputting a high voltage greater than the power source voltage as the driving source signal in response to the second word line driving signal and the control signal during the succeeding time period of the transition period; and
  a word line control unit for activating the word line at a voltage level of the driving source signal in response to the first and second word line driving signals.

12. The semiconductor memory device as recited in claim 11, wherein the access control unit includes:
  a delay unit for delaying the active signal for a preset time to output a delayed active signal;
  a timing detection unit for outputting a beginning control signal and an end control signal, each control signal respectively activated during a beginning and an end of an activation period of the word line based on the active signal and the delayed active signal; and
  a logic combination unit for outputting the control signal by combining the beginning control signal and the end control signal.

13. The semiconductor memory device as recited in claim 11, wherein the voltage supplying unit includes:
  a first pull-up driving unit for driving the driving source signal at the high voltage in response to the second word line driving signal;
  a pull-down driving unit for driving the driving source signal at a ground voltage in response to the second word line driving signal;
  a switch for determining whether or not to supply outputs of the first pull-up driving unit and the pull-down driving unit as the driving source signal in response to the control signal; and
  a second pull-up driving unit for driving the driving source signal at the power source voltage in response to the control signal.

14. The semiconductor memory device as recited in claim 13, wherein the second pull-up driving unit includes a PMOS transistor driving the driving source signal at the power source voltage when the control signal is activated at a logic low level.

15. The semiconductor memory device as recited in claim 13, wherein the switch includes an NMOS transistor supplying the outputs of the first pull-up driving unit and the pull-down driving unit as the driving source signal when the control signal is deactivated at a logic high level.

16. The semiconductor memory device as recited in claim 11, wherein, after finishing an active operation and a refresh operation, the word line control unit supplies the power source voltage as the driving source signal for the predetermined time period, and then discharges the word line to a ground voltage in response to the first and second word line driving signals of the high voltage level.

17. A method for driving a semiconductor memory device, comprising:
  generating a first word line driving signal based on a word line activation signal and a first address information signal;
  generating a second word line driving signal based on the word line activation signal and a second address information signal;
  outputting a control signal for determining a predetermined time period of a transition period between a deactivation of a word line and an activation of the word line in response to an active signal;
  outputting a power source voltage as a driving source signal during the predetermined time period, and then outputting a high voltage greater than the power source voltage as the driving source signal in response to the second word line driving signal and the control signal during the succeeding time period of the transition period; and
  activating the word line at a voltage level of the driving source signal in response to the first and second word line driving signals.

18. The method of claim 17, further comprising:
after finishing activating the word line, supplying the power source voltage as the driving source signal for the predetermined time period, and then discharging the word line to a ground voltage in response to the first and second word line driving signals of the high voltage level.

19. The method of claim 18, further comprising:
generating the control signal activated to supply the power source voltage for the predetermined time period during a beginning and an end of an activation period of the word line in response to the active signal.

* * * * *